United States Patent [19]

Tsunashima et al.

[11] Patent Number: 4,791,074
[45] Date of Patent: Dec. 13, 1988

[54] METHOD OF MANUFACTURING A SEMICONDUCTOR APPARATUS

[75] Inventors: Yoshitaka Tsunashima, Kawasaki; Keisaku Yamada, Ebina; Takako Kashio, Tokyo, all of Japan

[73] Assignee: Kaubshiki Kaisha Toshiba, Kawasaki, Japan

[21] Appl. No.: 73,473

[22] Filed: Jul. 15, 1987

[30] Foreign Application Priority Data

Aug. 29, 1986 [JP] Japan ................................ 61-201703
Sep. 30, 1986 [JP] Japan ................................ 61-231763

[51] Int. Cl.⁴ .......................................... H01L 21/385
[52] U.S. Cl. ..................... 437/160; 437/13; 437/946; 148/DIG. 158
[58] Field of Search ................. 437/160, 13, 946; 148/DIG. 158

[56] References Cited

U.S. PATENT DOCUMENTS

| | | | |
|---|---|---|---|
| 3,576,685 | 4/1971 | Swann et al. | 437/160 X |
| 3,874,936 | 4/1975 | d'Hervilly et al. | 437/11 |
| 3,966,515 | 6/1976 | Guthrie | 437/160 X |
| 4,061,506 | 12/1977 | McElroy | 437/11 |
| 4,114,256 | 9/1978 | Thibault et al. | 437/11 |
| 4,575,920 | 3/1986 | Tsunashima | 437/194 X |
| 4,579,609 | 4/1986 | Reif et al. | 437/946 X |

Primary Examiner—George T. Ozaki
Attorney, Agent, or Firm—Oblon, Fisher, Spivak, McClelland & Maier

[57] ABSTRACT

According to the present invention, a method of manufacturing a semiconductor apparatus is provided which comprises the steps of (a) depositing a boron layer on a silicon substrate, and (b) thermally diffusing boron from said boron layer into said silicon substrate. The present invention, which is characteristically based on the solid phase diffusion process, enables even a thin layer to be deposited. Further, unlike the ion implantation process, the present invention enables an impurity to be uniformly diffused even into an inclined plane. Unlike the case where boron-containing glass is used as a diffusion source, the invention enables a sufficient amount of boron to be diffused even at a temperature lower than 1000° C.

12 Claims, 5 Drawing Sheets

METHOD OF MANUFACTURING A SEMICONDUCTOR APPARATUS

BACKGROUND OF THE INVENTION

This invention relates to a method of manufacturing a semiconductor device and, more particularly, to a method of manufacturing a semiconducoor device which features an improvement in the step of fabricating a p-type conductive layer (an impurity layer).

The conventional impurity-diffusing processes performed during the manufacture of a semiconductor apparatus comprise the ion implantation method and the solid phase diffusion method, which makes use of thermal diffusion of impurity from an impurity-containing material into a substrate. The former process comprises, as is shown in FIG. 3A, the step of directly implanting ions in the surface of silicon substrate 31, and later thermally diffusing the introduced ions. This process offers the advantage in that it ensures accurate electrical control of the quantity of impurities to be absorbed in the substrate surface. The latter process comprises, as is shown in FIG. 3B, the step of depositing an impurity-containing glass layer 32 on silicon substrate 31, and later thermally diffusing the impurity contained in glass layer 32 into silicon substrate 31. Though having the merit of providing a relatively thin impurity-containing layer, use of the latter process is as yet not as widespread throughout the industry as the ion implantation method.

Since semiconductor elements are becoming more and more miniaturized, they require an increasingly thinner impurity layer contained in a silicon substrate. However, the aforementioned processes of ion implantation and solid phase diffusion are accompanied by the following drawbacks.

In the case of the ion implantation process, the diffusion layer cannot be formed sufficiently thin beyond a predetermined extent, on account of the so-called channeling effect, even if an implantation is made by applying as low an acceleration voltage as possible. The channeling effect becomes more prominent in boron than in n-type phosphorus or arsenic, and as a result, greatly hindering the formation of a p-type impurity layer. Moreover, ion-implanted impurities which have to be thermally activated unavoidably tend to be more diffused than is the case immediately after ion implantation, thereby resulting in greater difficulties in the quest to provide a satisfactorily thin diffusion layer.

A further drawback accompanying the ion implantation process is that difficulties arise when attempting to deposit a uniform diffusion layer over an inclined plane. In recent years, the technique of digging a groove in a silicon substrate and providing a capacitor, through using the inner walls of the grooves, has been proposed, with the aim of resolving the problem of a decrease in the capacity of an MOS capacitor, which can arise from the miniaturization of an element. As has been explained above, however, it is extremely difficult to effect the uniform introduction of an impurity into the side wall of the aforementioned groove.

When it is attempted to perform solid phase diffusion, a problem arises in that the diffusion coefficient of both boron and arsenic (generally employed as an impurity in this process) in glass is less than 1% of that in a silicon substrate. In other words, in the solid phase diffusion process, the slow rate of impurity diffusion in the glass defines the rate of diffusion in a silicon substrate. Therefore, in order to increase the rate of introduction of an impurity into the silicon substrate, the diffusion process must be carried out at a temperature higher than 1000° C. As a result, the impurity will be unavoidably diffused through the silicon substrate, thereby rendering impossible the formation of a sufficiently thin junction.

SUMMARY OF THE INVENTION

This invention is intended to provide a method of manufacturing a semiconductor apparatus free from the aforementioned drawbacks which comprises the steps of:

(a) depositing a boron layer on a silicon substrate;
(b) thermally diffusing the boron into said silicon substrate; and
(c) forming a metal wire layer on said boron layer

DETAILED DESCRIPTION OF THE INVENTION

Figure 1A:
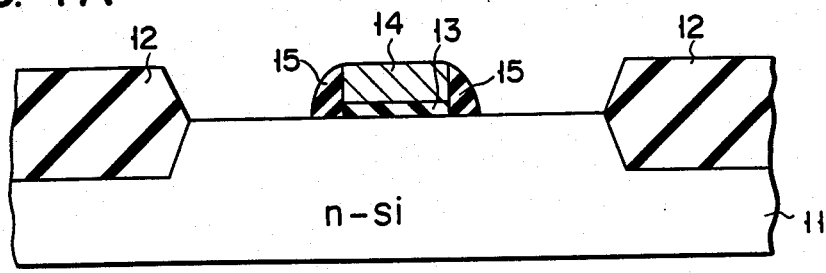
FIGS. 1A to 1D, 4A to 4D and 6A to 6D are sectional views of the sequential steps of manufacturing MOS transistors according to Example 1, 3 and 4 of the present invention.

The present invention is fundamentally characterized in that the solid phase diffusion process is applied, and the source of the diffusing impurity consists of a boron layer.

The boron layer is deposited on a silicon substrate or in an opening provided in an insulation layer mounted on the silicon substrate by vacuum evaporation, sputtering, CVD (Chemical Vapor Deposition), etc. The deposition of the boron layer should preferably be made after the natural oxide layer settled on the silicon substrate surface is etched off by dilute fluoric acid or by the argon sputtering process in a vacuum. If boron is deposited in a vacuum in the same vessel where argon sputtering is performed, the boron layer can be deposited under a well-controlled condition. If the boron is deposited with a thickness smaller than 100 Å, then the object can be fully attained.

The use of boron in the present invention is for the reason that boron can be formed into a thin layer and further uniformly deposited in the silicon substrate. Another p-type impurity could be applicable to this invention, provided that it can be uniformly applied over a silicon substrate. The same applies to an n-type impurity, for example, phosphorus. For the present invention, it is preferred that boron be diffused in a vacuum or in an atmosphere of an inert gas at a temperature ranging from 700° to 1100° C.

This invention, which is characteristically based on the solid phase diffusion process, enables even a thin layer to be deposited. Further, unlike the ion implantation process, the present invention enables an impurity to be uniformly diffused even into an inclined-plane. Unlike the case where boron-containing glass is used as a diffusion source, the invention enables a sufficient amount of boron to be diffused even at a temperature lower than 1000° C.

Another characteristic process of the present invention is to deposit a metal wire layer on a boron layer used as a diffusion source after the diffusion of boron, thereby effecting ohmic contact between the silicon layer and electrode.

Where, as previously mentioned, a boron layer is deposited in an opening provided in an insulation layer mounted on the silicon layer, it is advisable to provide a p-type conductive layer in advance and to form the above mentioned opening in that place. This process has the merit that when aluminum or aluminum alloy is applied as metal wire, aluminum is prevented from melting into the silicon (aluminum-silicon reaction), because the prior boron diffusion causes the p-type impurity (B) to be diffused again, thereby regaining a sufficient concentration. In other words, since aluminum is prevented from penetrating an impurity layer, even if made thin, the short-circuiting of the P-N junction can be suppressed.

In the aforementioned case, the miniaturization of an element reduces a margin which might be provided for the connection between the opening and the conductive layers. Due to an irregular masking, therefore, the portion where a conductive layer is not formed may sometimes be exposed. Prior to forming a metal wire layer, however, boron is diffused throughout the opening, thus preventing the metal wire from short circuiting with the silicon substrate.

After depositing on the insulation layer, the boron layer is changed into boron-doped silicate glass (BSG) due to heat treatment applied for the diffusion of boron. The BSG layer can be easily etched off, for example, by applying dilute hydrofluoric acid. However, such etching can be disposed with.

The metal wire may be formed on the boron layer immediately after it is diffused. On the other hand it is possible to provide an opening in a boron diffusion region after the mounting of the insulation layer thereon, and to set the metal wire in said opening.

The present invention offers the advantages that it is applicable not only to an MOS transistor but also any other type of semiconductor apparatus such as a bipolar transistor and a capacitor; an efficient amount of impurity can be diffused even at a low temperature; an impurity layer can be formed with a high surface concentration and a shallow junction depth; and consequently, the invention can make a noticeable contribution to the high integration of a semiconductor element.

DETAILED DESCRIPTION OF THE PREFERRED EMBODIMENTS

EXAMPLE 1

As shown in FIG. 1A, field insulation layer 12 is selectively formed on n-type single crystal silicon substrate 11 by the conventional process, thereby providing an element region surrounded by field insulation layer 12 composed of silicon dioxide. Mounted later on said semiconductor region are gate oxide layer 13 and gate electrode 14, in that order. After the CVD of silicon dioxide and the subsequent reactive ion etching, silicon oxide layer 15 is formed on the side walls of gate electrode 14.

Figure 1B:
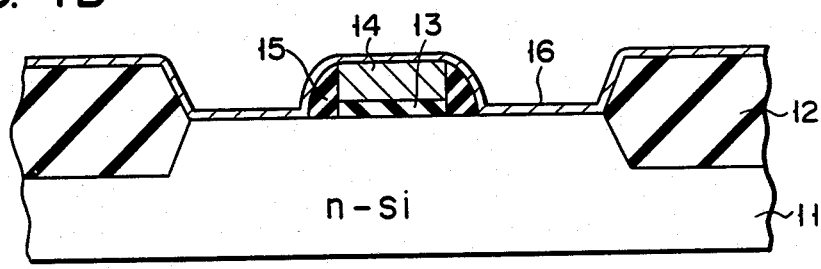

Later, a natural oxide layer positioned in the region where the p-type conductive layer is to be formed is eliminated in a vacuum by argon sputtering, thereby exposing a silicon plane. Later, as shown in FIG. 1B, boron is deposited all over the surface of the substrate, thereby forming boron layer 16 with a thickness of 50 Å.

Figure 1C:
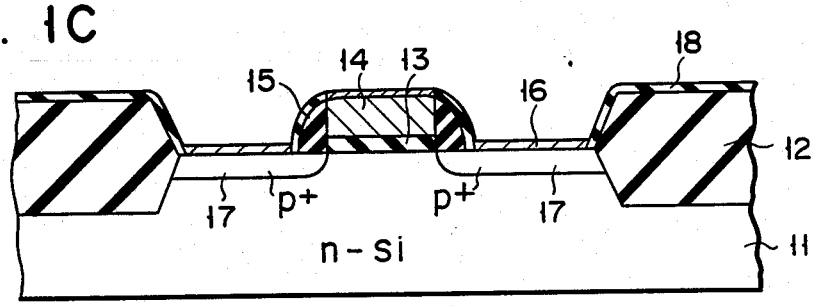

Later, in a vacuum, heat treatment is applied for 30 minutes at 800° C. Thus, boron is diffused in the predetermined region of silicon substrate 11 as illustrated in FIG. 1C, thereby forming p-type conductive layer (impurity layer) 17, namely, source and drain regions. At this time, boron layer 16 is still retained on the impurity layer 17 and gate electrode 14. However, boron attached to field insulation layer 12 and oxide layers 15 is diffused into the silicon dioxide, thereby providing boron-doped silicate glass (BSG) 18. BSG material 18 insulates gate electrode 14 from both adjacent p-type conductive layers 17.

Figure 1D:
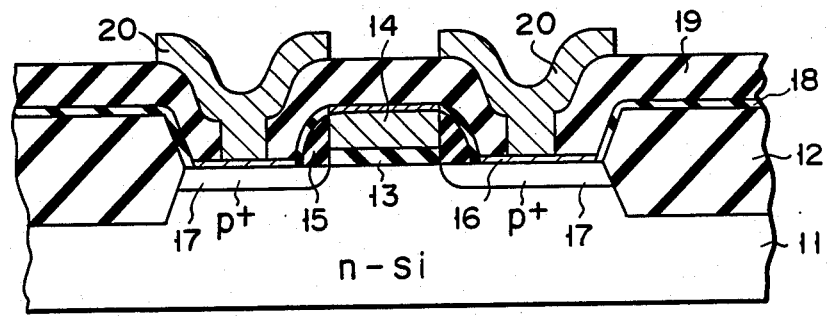

Later, as indicated in FIG. 1D, CVD silicon oxide layer 19 is formed all over the surface of the substrate produced up to this point. Openings are formed in CVD silicon oxide layer 19 to mount electrode layers 20 respectively formed of aluminum or molybdenum. The aforementioned steps finish the fabrication of the p-channel MOS transistor which has p-type conductive layer 17 of low electric resistance and a shallow about 0.12 μm.

EXAMPLE 2

Figure 2:
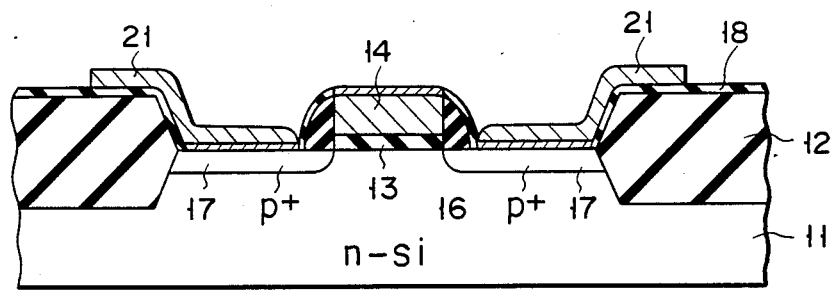
FIG. 2 is a sectional view of an MOS transistor according to a second embodiment of the invention.
Figure 3A:
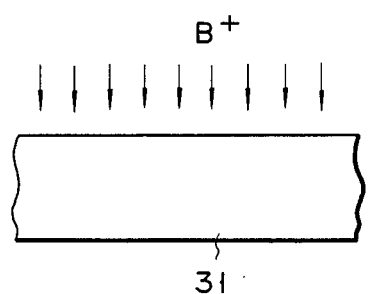
FIGS. 3A and 3B are sectional views of the conventional impurity layer-forming processes.
Figure 3B:
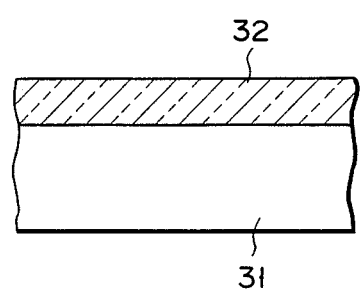

Description may now be made with reference to FIG. 2 of an MOS transistor according to a second embodiment of the present invention. In this embodiment, after the step shown in FIG. 1C, an insulation oxide layer is not deposited, but high melting-point metal layer 21 prepared from molybdenum or tungsten is coated in a vacuum. Metal layer 21 contacts boron layer 16 formed on p-type conductive layer 17 over a broad area by means of patterning. Metal layer 21 may be coated by the CVD process.

In this Example, the same effect was realized as in Example 1 by taking the above-mentioned steps. Example 2, where high melting-point metal layer 21 is applied, offers the advantage of decreasing the parasitic resistance in the p-type conductive layer.

EXAMPLE 3

Figure 4A:
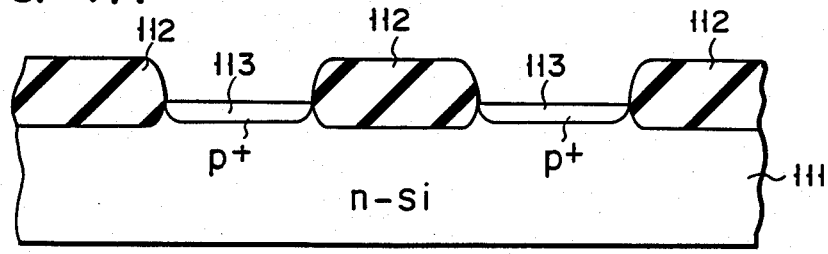

As can be seen from FIG. 4A, field insulation layers 112 are deposited on n-type silicon substrate 111 by the conventional process. Boron is introduced into silicon substrate 111 by means of ion implantation. The whole substrate was subjected to heat treatment for 30 minutes at a temperature of 900° C., thus providing thin p-type impurity layer 113 of about 0.2 micron.

Figure 4B:
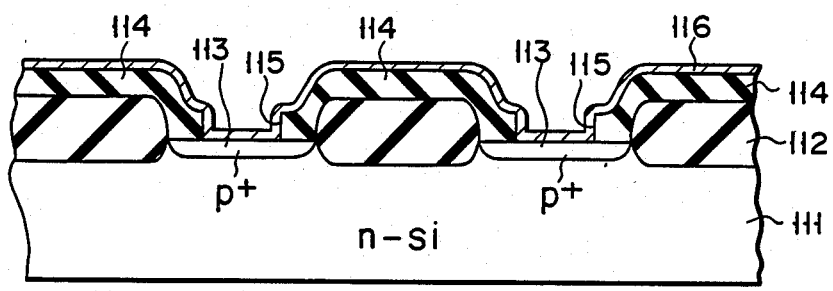
Figure 4C:
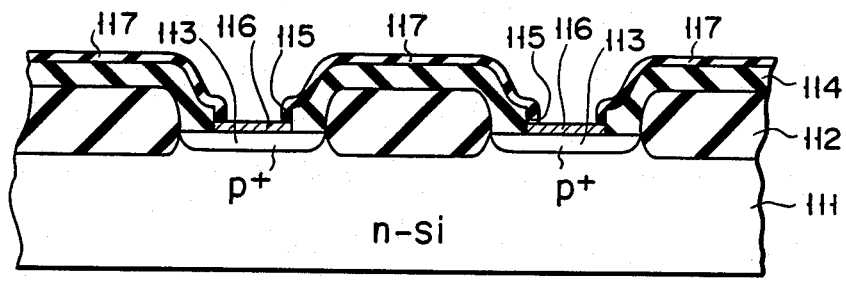

Later, as indicated in FIG. 4B, silicon dioxide layer 114 is formed over the whole surface of the substrate by the chemical vapor deposition (CVD) process. Openings 115 are provided in parts of silicon oxide layer 114. Later, boron layer 116 is formed over the entire surface of the substrate with a thickness of about 70 Å. Then the substrate was subjected to heat treatment in a vacuum at a temperature of 900° C. for 30 minutes (FIG. 4C), thereby forming p-type conductive layers.

Figure 4D:
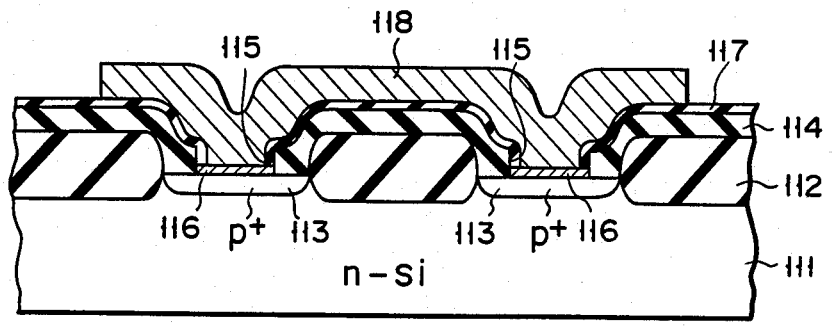

Later, as shown in FIG. 4D, an aluminum layer is formed by vacuum deposition over the entire surface of the substrate, and later, aluminum wire layer (metal wire layer) 118 is provided by patterning. At this time, aluminum wire layer 118 does not penetrate the underlying conductive layers. In addition, contact resistance between p-type impurity layer 113 and aluminum wire layer 118 is sufficiently low.

According to this Example, aluminum wire layer 118 does not pierce through p-type impurity layer 113, however thin it may be. Therefore, good ohmic contact is ensured between p type impurity layer 113 and aluminum wire layer 118.

Figure 5:
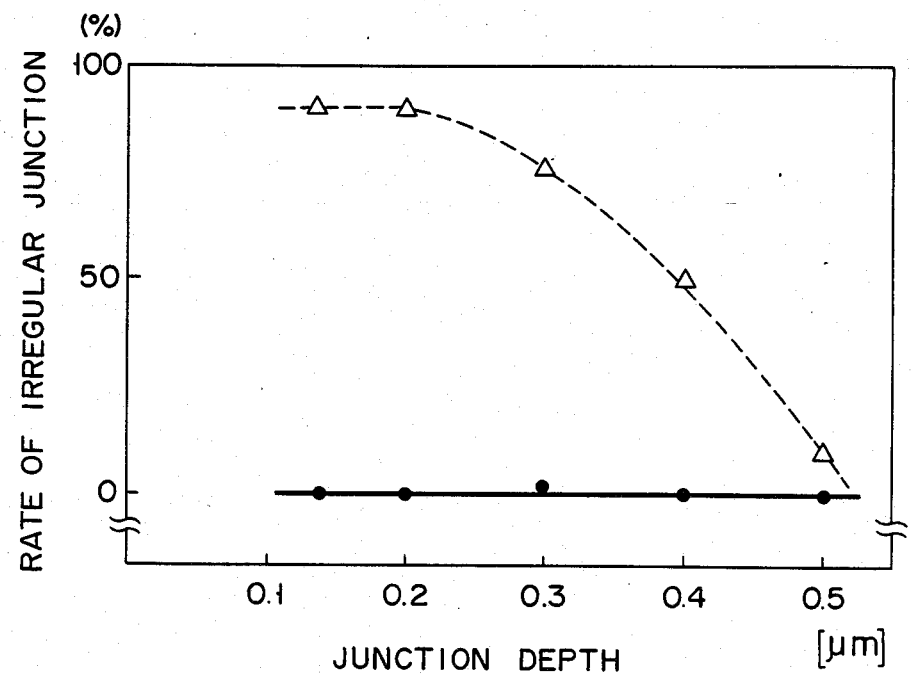
FIG. 5 diagramatically indicates the relationship between the junction depths and the corresponding percentage heights of impurity formation.

FIG. 5 diagramatically indicates the relationship between the depth of an impurity layer (junction depth) and the rate of formation, expressed as percent of irregular junctions caused by the penetration of the aluminum wire layer. In FIG. 5, notation Δ represents the conventional process of forming an aluminum wire layer, and notation • denotes the process of the present invention of forming an aluminum wire layer. In the conventional process, aluminum wire layer 118 was formed immediately after the etching formation of opening 115. In both the conventional and present processes, sintering is performed at a temperature of 450° C. for 30 minutes after the formation of an aluminum wire layer in order to establish an ohmic contact.

FIG. 5 shows that in the conventional process, the shallower the p-type impurity layer is formed, the worse the ohmic contact becomes, and when the depth of the p-type impurity layer reaches 0.3 micron, no ohmic contact can be substantially attained; in contrast, the process of the present invention always ensures ohmic contact regardless of the depth of an impurity layer. It is presumed that in the semiconductor device of the present invention, the boron layer deposited on the p-type impurity layer acts as a sort of barrier for preventing the penetration of the aluminum wire layer.

EXAMPLE 4

Figure 7:
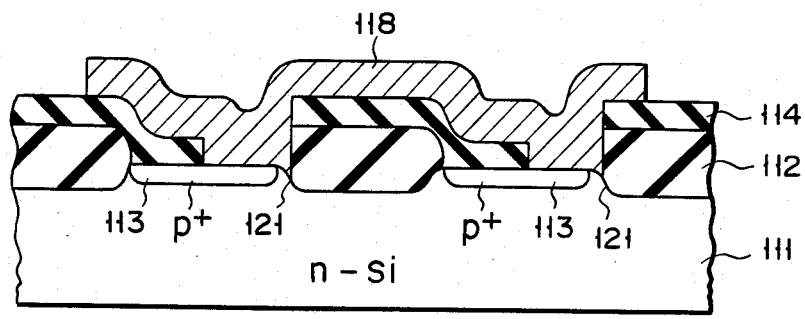
FIG. 7 illustrates the sectional view of an MOS transistor in which the masking irregularity took place.
Figure 6A:
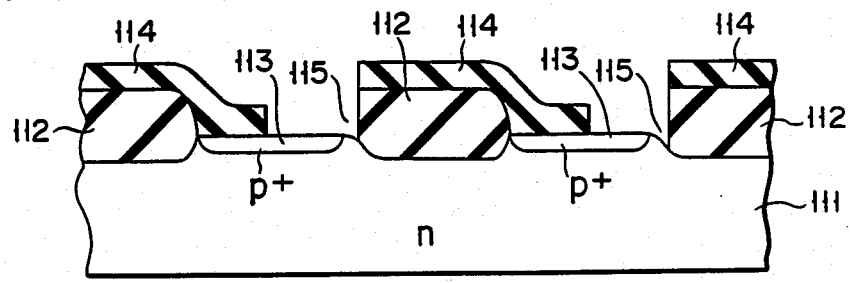

When masking is carried out irregularly, not only p-type impurity layer 113 but also part of the n-type silicon substrate surface is exposed in opening 115 of silicon dioxide layer 114 (FIG. 6A). In the conventional process, the aluminum wire layer is formed in fact under the condition shown in FIG. 6A. If, therefore, an irregularity of masking should take place, the conventional process is accompanied by the drawback that, as seen in FIG. 7, a direct contact appears between aluminum wire layer 118 and part 121 of silicon substrate 111, thus leading to short circuiting between silicon substrate 111 and aluminum wire layer 118.

Figure 6B:
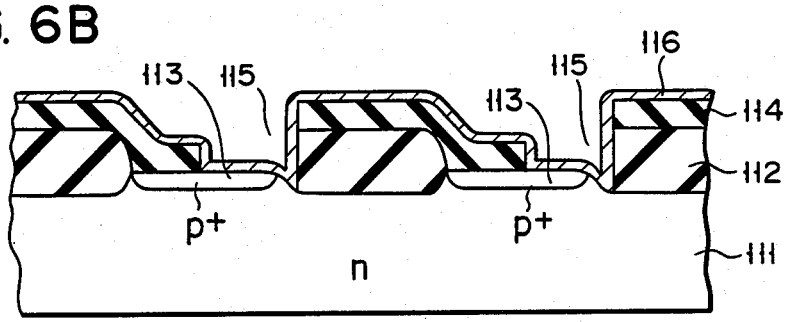
Figure 6C:
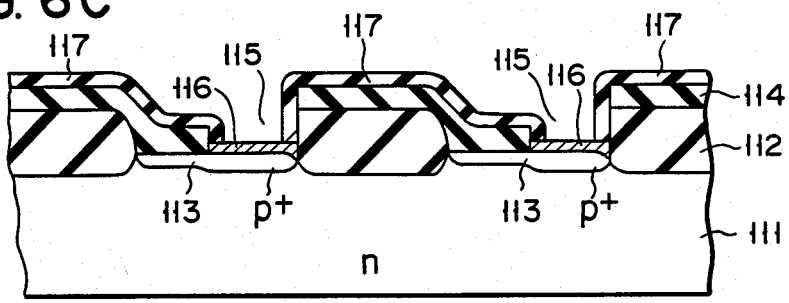
Figure 6D:
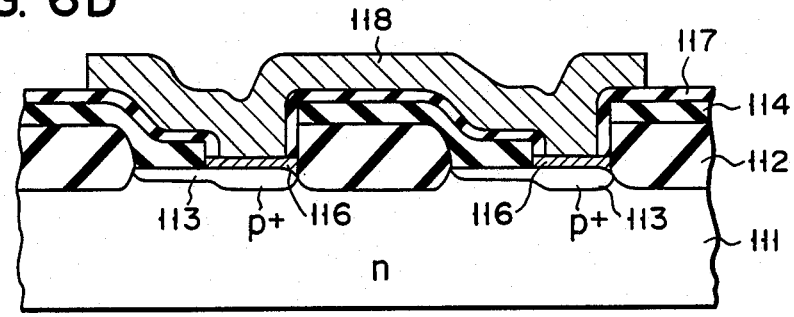

In the process of the present invention, however, boron layer 116 is deposited as shown in FIG. 6B, and boron is diffused. Therefore, as indicated in FIG. 6C, that portion of the surface of the silicon substrate which is exposed in opening 115 constitutes p-type impurity layer contacting diffusion layer 113. Even if, therefore, an aluminum wire layer is formed thereafter, aluminum wire layer 118 does not contact n-type silicon substrate 111 (as seen from FIG. 6D). Therefore, even if irregular masking should take place, it is possible to prevent short circuiting between aluminum wire layer 118 and silicon substrate 111.

The present invention is not limited to the aforementioned embodiments. The invention permits the application of an alloy consisting of mainly aluminum and any other metal. Further, the mounting of the boron layer may be carried out not only by vacuum evaporation but by sputtering or a CVD process.

It is advised to form the boron layer only on a p-type impurity layer which is intended to make an ohmic contact with a metal wire layer. Therefore, it is possible to eliminate the boron layer formed on the silicon dioxide layer after the step of FIG. 4B or to take off the BSG layer after the process shown in FIG. 4C. Obviously, the present invention can be practiced in any modification without departing from the scope of the invention.

What is claimed is:

1. A method of manufacturing a semiconductor device, which comprises the steps of:
   (a) depositing a boron layer on a silicon substrate by vacuum evaporating elemental boron onto the silicon substrate; and
   (b) thermally diffusing boron from said boron layer into said silicon substrate.

2. The method according to claim 1, wherein said deposition of the boron layer is carried out after the argon sputtering of the substrate surface.

3. The method according to claim 1, wherein said boron layer is formed with a thickness smaller than 100 Å.

4. The method according to claim 1, wherein said diffusion of boron is carried out by heating said silicon substrate to a temperature ranging from 700° to 1000° C.

5. The method according to claim 1, further comprising the step of forming a metal wire layer on said boron layer after the diffusion of boron from the boron layer.

6. The method of manufacturing a semiconductor device, which comprises the steps of:
   (a) selectively forming an insulation layer on a silicon substrate;
   (b) depositing a boron layer on at least said silicon substrate by vacuum evaporating elemental boron onto the silicon substrate having the formed insulation layer thereon in an opening provided in said insulation layer;
   (c) thermally diffusing boron form said boron layer into said silicon substrate; and thereafter
   (d) forming a metal wire layer on said boron layer.

7. The method according to claim 6, wherein said diffusion of boron is carried out by heating said silicon substrate to a temperature ranging from 700° to 1100° C.

8. The method according to claim 6, wherein said deposition of a boron layer is carried out after forming a p-type conductive layer in said silicon substrate, in an area of said opening provided in said insulation layer.

9. The method according to claim 8, wherein said p-type conductive layer is formed on the entire or a part of the area of said opening.

10. The method according to claim 6, wherein the metal wire layer is formed after said diffusion of boron over said opening.

11. The method according to claim 6, wherein said boron layer is deposited on both said insulation layer, which is composed of silicon dioxide, and said silicon substrate, said boron layer deposited on said insulation layer being converted into boron-doped silicate glass (BSG) by the heat treatment applied for the diffusion of boron.

12. The method of forming an integrated semiconductor device according to claim 6 wherein said steps (a) to (d) are carried out after forming a p-type conductive layer in said silicon substrate in an area of an opening provided in a field insulation layer, and step (a) is carried out to create an opening to register with the opening in the field insulation layer, the boron layer having a thickness smaller than 100 Å and the thermal diffusion occurring at 700° to 1000° C.

* * * * *